United States Patent
Ando et al.

(10) Patent No.: US 11,855,148 B2
(45) Date of Patent: Dec. 26, 2023

(54) VERTICAL FIELD EFFECT TRANSISTOR WITH DUAL THRESHOLD VOLTAGE

(71) Applicant: International Business Machines Corporation, Armonk, NY (US)

(72) Inventors: Takashi Ando, Eastchester, NY (US); Ruilong Xie, Niskayuna, NY (US); Pouya Hashemi, Purchase, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 177 days.

(21) Appl. No.: 17/452,341

(22) Filed: Oct. 26, 2021

(65) Prior Publication Data
US 2023/0128314 A1     Apr. 27, 2023

(51) Int. Cl.
| | |
|---|---|
| *H01L 29/10* | (2006.01) |
| *H01L 29/06* | (2006.01) |
| *H01L 29/78* | (2006.01) |
| *H01L 29/423* | (2006.01) |
| *H01L 29/66* | (2006.01) |

(52) U.S. Cl.
CPC ...... *H01L 29/1033* (2013.01); *H01L 29/0607* (2013.01); *H01L 29/42372* (2013.01); *H01L 29/66666* (2013.01); *H01L 29/7827* (2013.01)

(58) Field of Classification Search
CPC ........... H01L 29/66666; H01L 29/7827; H01L 29/1033
See application file for complete search history.

(56) References Cited

U.S. PATENT DOCUMENTS

| | | | |
|---|---|---|---|
| 8,012,828 B2 | 9/2011 | Min et al. | |
| 8,710,583 B2 | 4/2014 | Ananthan et al. | |
| 9,431,461 B2 | 8/2016 | Park | |
| 9,634,109 B2 | 4/2017 | Oh et al. | |
| 10,276,575 B2 | 4/2019 | Walke et al. | |
| 10,804,391 B2 | 10/2020 | Kwon et al. | |
| 2014/0166981 A1 | 6/2014 | Doyle et al. | |
| 2015/0236086 A1 | 8/2015 | Colinge et al. | |

(Continued)

FOREIGN PATENT DOCUMENTS

| | | |
|---|---|---|
| TW | 201626572 A | 7/2016 |
| WO | 2017171824 A1 | 10/2017 |

OTHER PUBLICATIONS

International Search Report and Written Opinion for PCT Application No. PCT/CN2022/118124, dated Oct. 25, 2022.

(Continued)

*Primary Examiner* — Matthew C Landau
*Assistant Examiner* — Mark Hatzilambrou
(74) *Attorney, Agent, or Firm* — Patterson + Sheridan, LLP

(57) ABSTRACT

The embodiments herein describe a vertical field effect transistor (FET) with a gate that includes different work function metals (WFMs). Each WFM can be made up of one material (or one layer) or multiple materials forming multiple layers. In any case, the gate includes at least two different WFMs. For example, a first WFM may have a different material or layer than a second WFM in the gate, or one layer of the first WFM may have a different thickness than a corresponding layer in the second WFM. Having different WFMs in the gate can reduce the gate induced drain leakage (GIDL) in the FET.

15 Claims, 17 Drawing Sheets

(56) References Cited

U.S. PATENT DOCUMENTS

| | | | |
|---|---|---|---|
| 2015/0236092 A1 | 8/2015 | Yu et al. | |
| 2016/0218211 A1 | 7/2016 | Yuan et al. | |
| 2017/0047421 A1* | 2/2017 | Oh | H10B 61/22 |
| 2020/0027991 A1 | 1/2020 | Lee et al. | |

OTHER PUBLICATIONS

Hu et al., "Improving the Gate-Induced Drain Leakage and On-State Current of Fin-Like Thin Film Transistors with a Wide Drain," MDPI Applied Science, dated Aug. 20, 2018, pp. 1-11.

* cited by examiner

US 11,855,148 B2

VERTICAL FIELD EFFECT TRANSISTOR WITH DUAL THRESHOLD VOLTAGE

BACKGROUND

The present invention relates to gate in a vertical field effect transistor (FET) with at least two different work function metals (WFMs).

Gate induced drain leakage (GIDL) is a phenomenon which occurs when a high voltage is applied to the drain with the gate at a fixed voltage which forms a deep-depletion region near the gate-to-drain interface. Electron-hole pairs are generated by the tunneling of valence band electrons into the conduction band and collected by the drain and substrate. The effects of GIDL is more visible at higher $V_{DD}$ voltages and lower gate voltages $V_g$. Thinner oxide thicknesses and higher $V_{DD}$ (i.e., higher potential between the gate and the drain) enhance the electric field and therefore increase GIDL.

SUMMARY

One embodiment of the present invention is a vertical field effect transistor (VFET) that includes a drain, a source, a channel extending between the drain and source where the channel extends in a direction perpendicular to a substrate of the VFET, and a gate comprising a first work function metal (WFM) and a second WFM such that the second WFM is disposed between the first WFM and the source. Further, the first WFM includes a first plurality of layers and the second WFM comprises a second plurality of layers.

Another embodiment of the present invention is a VFET that includes a drain, a source, a channel extending between the drain and source where the channel extends in a direction perpendicular to a substrate of the VFET, and a gate including a first WFM and a second WFM such that the second WFM is disposed between the first WFM and the source. Further, the first WFM include a single layer and the second WFM comprises a first plurality of layers.

Another embodiment of the present invention is a method that includes forming a drain of the VFET, forming a first WFM of a gate above the drain where the first WFM is disposed in a first horizontal plane with a channel, forming a second WFM of the gate directly on the first WFM where the second WFM is disposed in a second horizontal plane with the channel, and forming a source of the VFET where the source and drain are coupled by a channel and the second WFM is disposed between the first WFM and the source.

DETAILED DESCRIPTION

The embodiments herein describe a vertical FET with a gate that includes different WFMs. Each WFM can be made up of one material (or one layer) or multiple materials forming multiple layers. For example, a first WFM may include a single layer of TiN while a second WFM, which is formed on top of the first WFM, has a first layer of TiN, a second layer of an Al-alloy (e.g., TiAlC), and a third layer of TiN. In another embodiment, the first and second WFMs have the same number of layers with each having the same material, but the thicknesses of the layers may be different. For example, both the first and second WFMs may have three layers formed by TiN/Al-containing alloy/TiN but the first layer of TiN for the first WFM may be thinner than the first layer of TiN for the second WFM. Thus, in this example, the first and second WFMs are different WFMs even though they have the same materials arranged in the same stacked configuration because at least one of their layers has a different thickness.

Having two different WFMs can reduce GIDL. For example, the first WFM can be deposited near the drain of the vertical FET. The composition and size of the first WFM can be set to reduce the electric field between the gate (or more specifically, the portion of the gate formed from the first WFM) and the drain. That is, the portion of the gate formed by the first WFM may have a different threshold voltage than the portion of the gate formed by the second WFM. Doing so reduces the GIDL which can improve performance and reduce power consumption in the FET.

No dual work function gates have been integrated into CMOS logic transistors, such as the vertical FET discussed herein.

Figure 1:
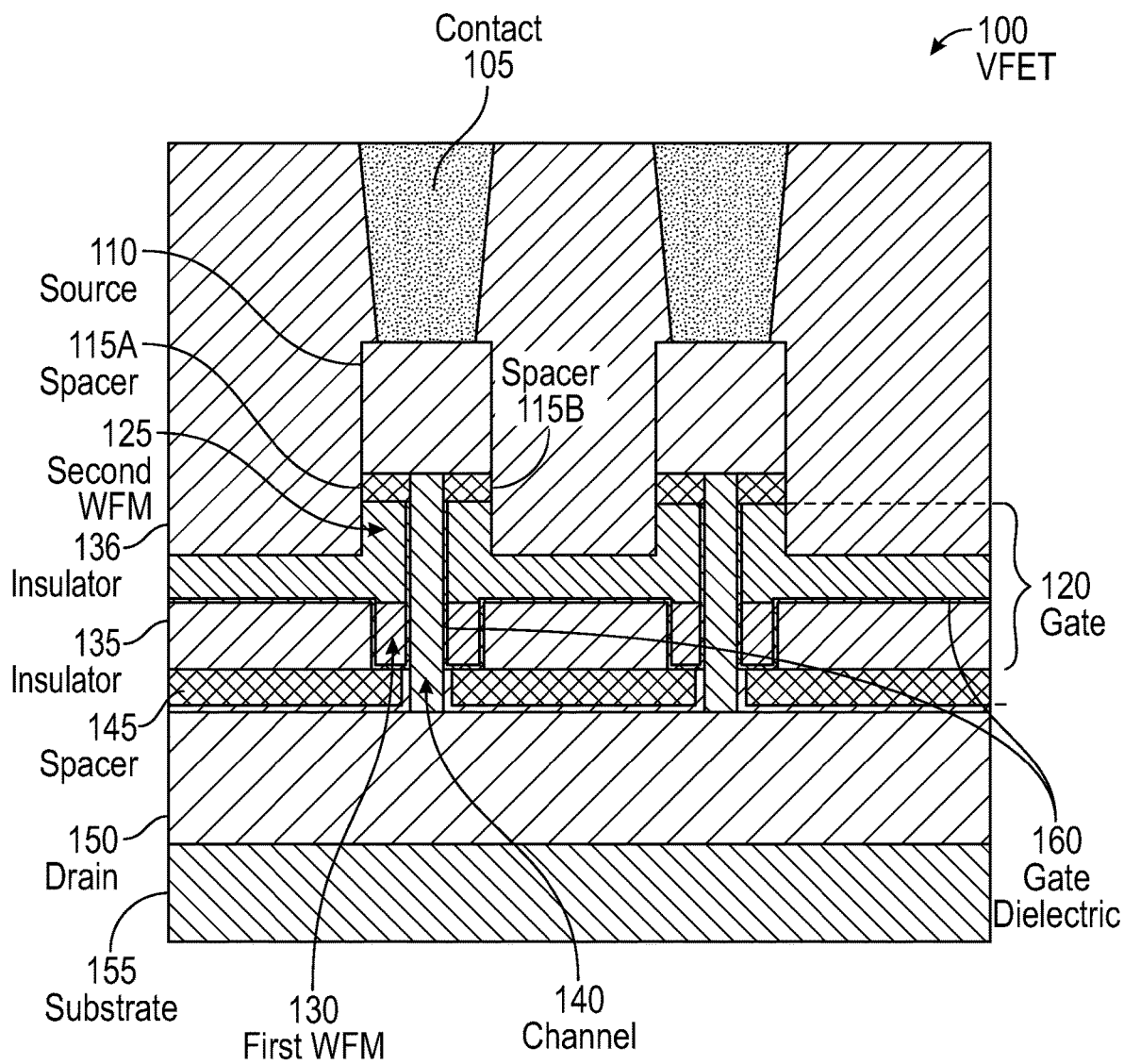
FIG. 1 illustrates a vertical FET with a gate that includes multiple WFMs, according to one embodiment.

FIG. 1 illustrates a vertical FET (VFET) 100 (e.g., a CMOS logic transistor) with a gate 120 that includes multiple WFMs, according to one embodiment. The VFET 100 includes a contact 105 (e.g., an electrically conductive material) that contacts a source 110 for the VFET 100. The underside of the source 110 directly contacts a spacer 115 and a channel 140. The spacer 115 can be any dielectric material that electrically insulates the source 110 from the gates. Further, the spacer 115 is shown as two separate portions 115A and 115B but these portions may be connected in different planes not shown in this cross sectional view of the VFET 100.

The source 110 can be a doped semiconductor material. For example, if the VFET 100 is a pFET, the source 110 is doped p type (along with the drain 150). If the VFET 100 is a nFET, the source 110 and drain 150 are doped n type. The embodiments herein are not limited to any particular type of semiconductor material for the source 110 and drain 150. These elements could all be formed from the same semiconductor, e.g., silicon, or could be a combination of different semiconductors.

The gate 120 is electrically separated from the channel 140 by a gate dielectric 160 (e.g., a high-k dielectric such as hafnium oxide). In this embodiment, the gate dielectric 160 also extends below the gate 120 such that the dielectric 160 separates the gate 120 from a bottom spacer 145.

In this example, the region of the gate adjacent to the channel 140 (i.e., the portion of the gate 120 disposed along the side of the channel 140) includes two WFMs. A first WFM 130 is disposed at a region of the gate 120 closest to the drain 150 while a second WFM 125 is disposed at a region of the gate 120 closest to the source 110. Notably, the first WFM 130 and the second WFM 125 are disposed in horizontal planes that include the channel 140, rather than being next to the source 110 or drain 150. Instead, the first WFM 130 and second WFM 125 are adjacent to the channel 140 (i.e., to the side of the channel 140) and disposed between the drain 150 and the source 110 (rather than the first WFM being disposed to the side of the drain 150).

As mentioned above, the first WFM 125 can have a different threshold voltage than the second WFM 130 which reduces the GIDL in the VFET 100. Each of the first and second WFMs 125, 130 can be formed from one material (e.g., one layer) or multiple materials (e.g., a stack of multiple layers). The different combinations of the materials and layers in the WFMs 125, 130 will be discussed below in FIGS. 3 and 4.

The lower side of the channel 140 directly contacts the drain 150, which in turn contacts a substrate 155 (e.g., a semiconductor substrate). Moreover, FIG. 1 illustrates a VFETs 100 with two fins. Moreover, while FIG. 1 illustrates two separate gates disposed on opposite sides of the channel 140 (which extends in a direction perpendicular to the substrate 155), in one embodiment, the gates may be connected on a different plane not shown in this cross sectional view. Thus, one electrical contact can be used to drive the same gate voltage on the gates on both sides of the channel 140. Further, the gate 120 may be a 3D structure with a horizontal cross sectional shape of a rectangle, ellipse, circle, etc. where the region of the 3D structure closest to the drain 150 is formed by the first WFM 130 and the upper region of the 3D structure closest to the source 110 is formed by the second WFM 125. Note that though this embodiment is illustrated using a VFET with two fins, the method and structure works for any number of fins (e.g. single fin device, 3-fin device, 4-fin device, etc.).

Figure 2A:
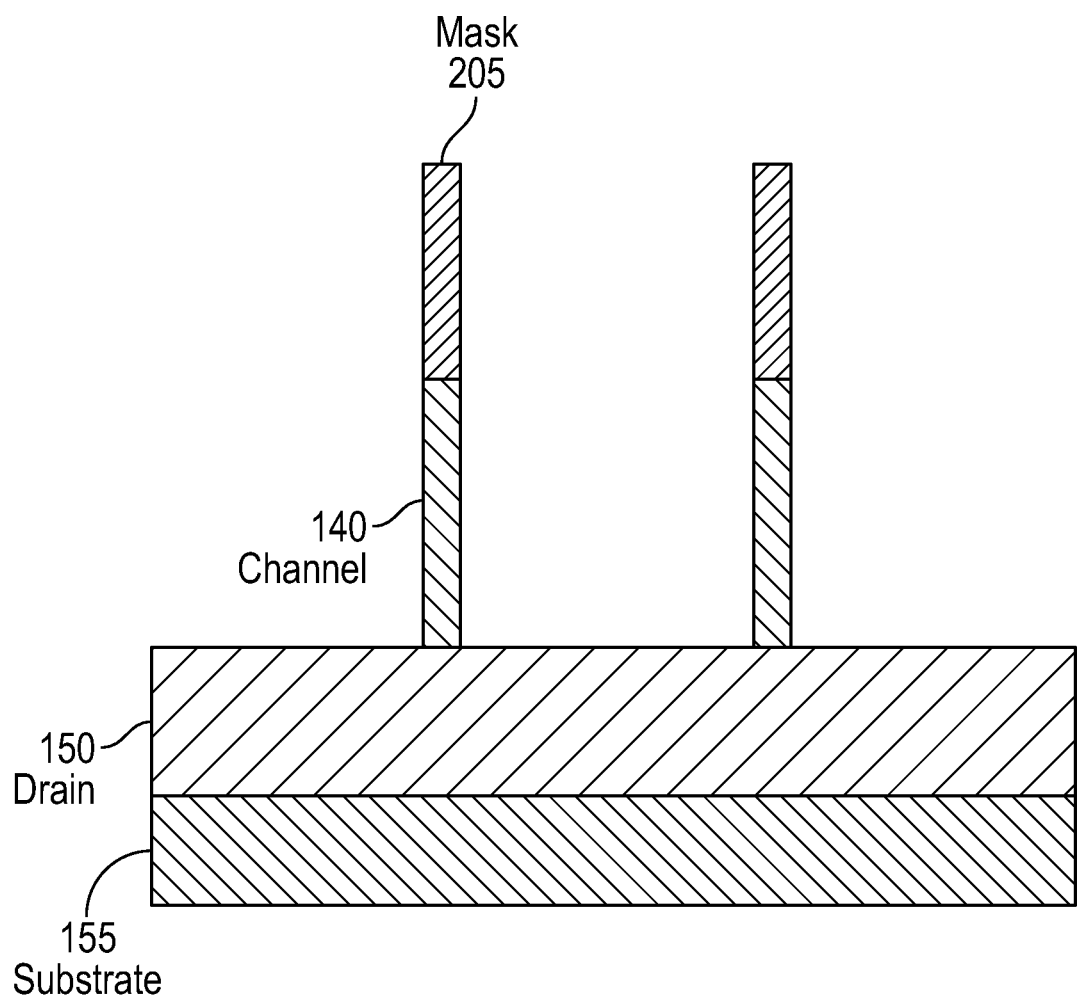
FIGS. 2A-2F illustrate a process for forming a gate in a vertical FET with multiple WFMs, according to one embodiment.

FIGS. 2A-2F illustrate a process for forming a gate in a vertical FET with multiple WFMs, according to one embodiment. FIG. 2A illustrates a partial structure where the channel 140 has already been formed on top of the drain 150 and the substrate 155. A mask 205 (e.g., a hard mask) is deposited on top of the channel 140, and may have been used during a previous etching process to form the channel 140. The embodiments herein can use any suitable process for patterning and forming the fins and bottom source/drain.

Figure 2B:
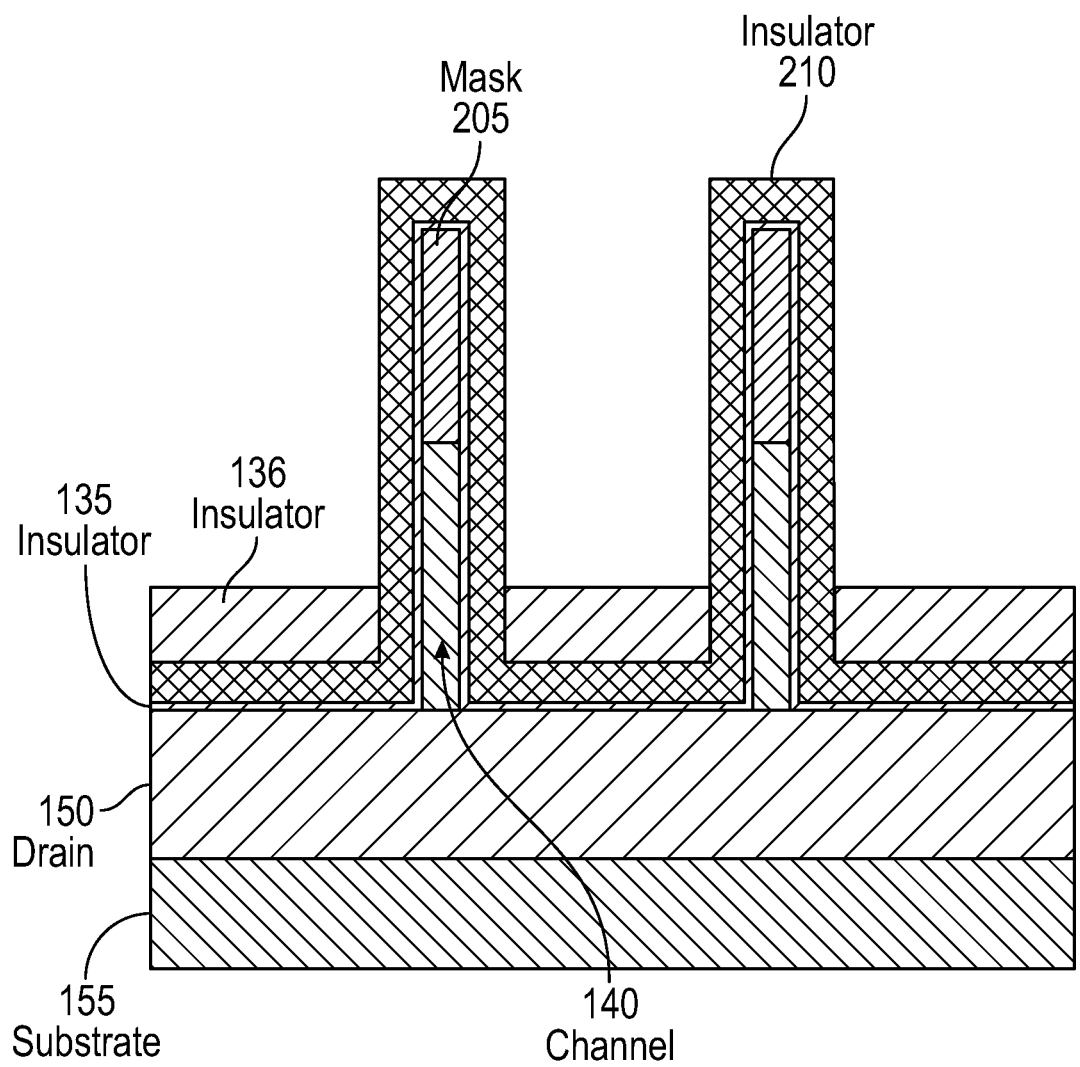

FIG. 2B illustrates conformally depositing a thin layer of the insulator 135 onto top of the drain 150, the sides of the channel 140, and the sides of the mask 205. Next, an insulator 210 (e.g., silicon dioxide or silicon nitride) is conformally deposited over the thin layer of the insulator 135. In one embodiment, the insulator 135 is a different material than the insulator 210. For example, the insulator 135 may be silicon dioxide while the insulator 210 is silicon nitride. After that, an additional layer of insulator 136 is deposited using a directional deposition process (e.g., gas cluster ion beam (GCM) deposition, high density plasma (HDP) deposition with cyclic etching back, etc.). The material of the insulator 136 should be different than layer 210, and it could be made with the same material as insulator 135, such as SiO2.

In one embodiment, when initially deposited, the insulator 136 may fill all the spaces and overfill over the layer 210. The insulator 136 can be etched back to the thickness shown in FIG. 2B, which uncovers a portion of the insulator 210 deposited on the hard mask 205 and the channel 140.

Figure 2C:
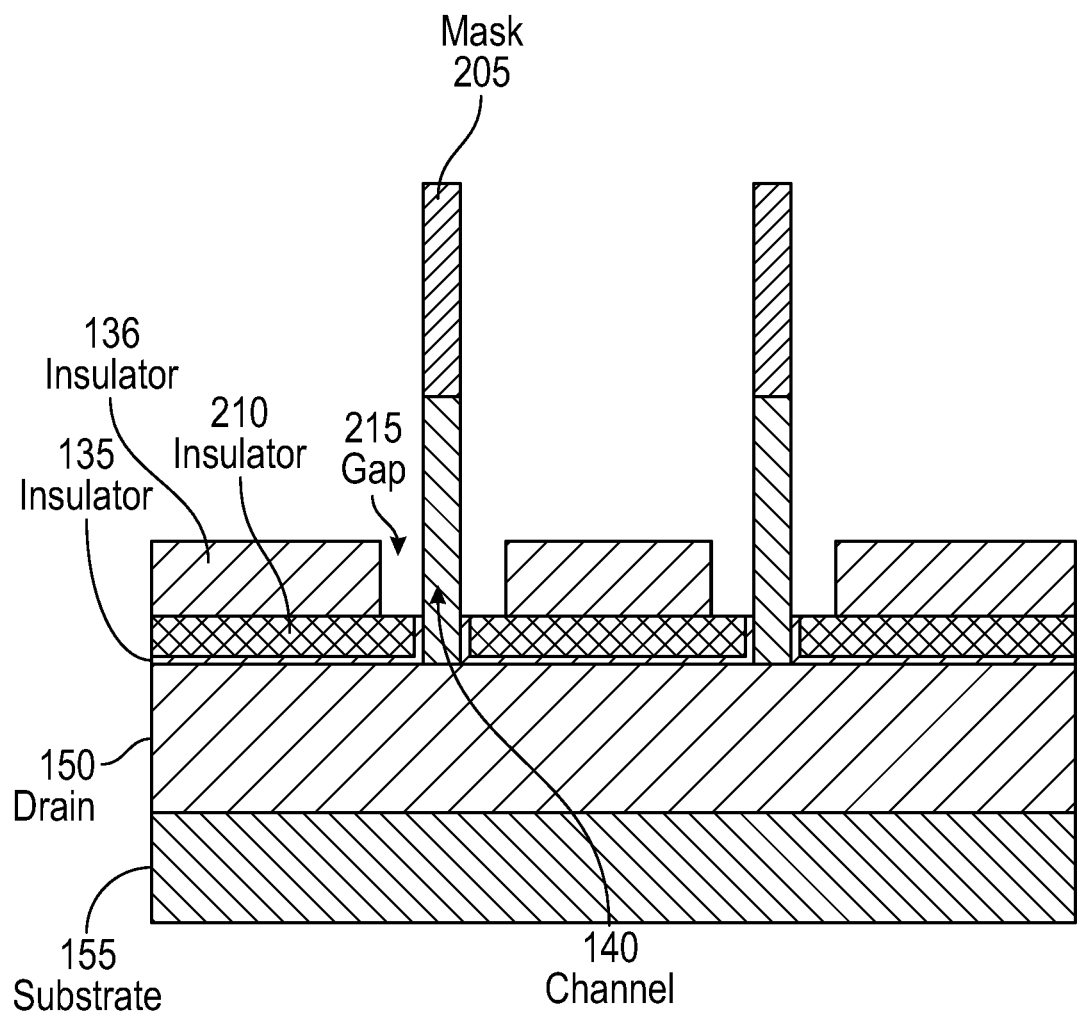

FIG. 2C illustrates removing the portion of the insulator 210 and insulator 135 covering the sides of the channel 140. That is, the width of the insulator 210 and the insulator 135 defines a width of a gap 215 between the sides of the channel 140 and the insulator 135. As discussed below, this gap 215 is used to form the gate for the VFET, particularly, this gap defines where the gate region which is controlled by first WFM.

Figure 2D:
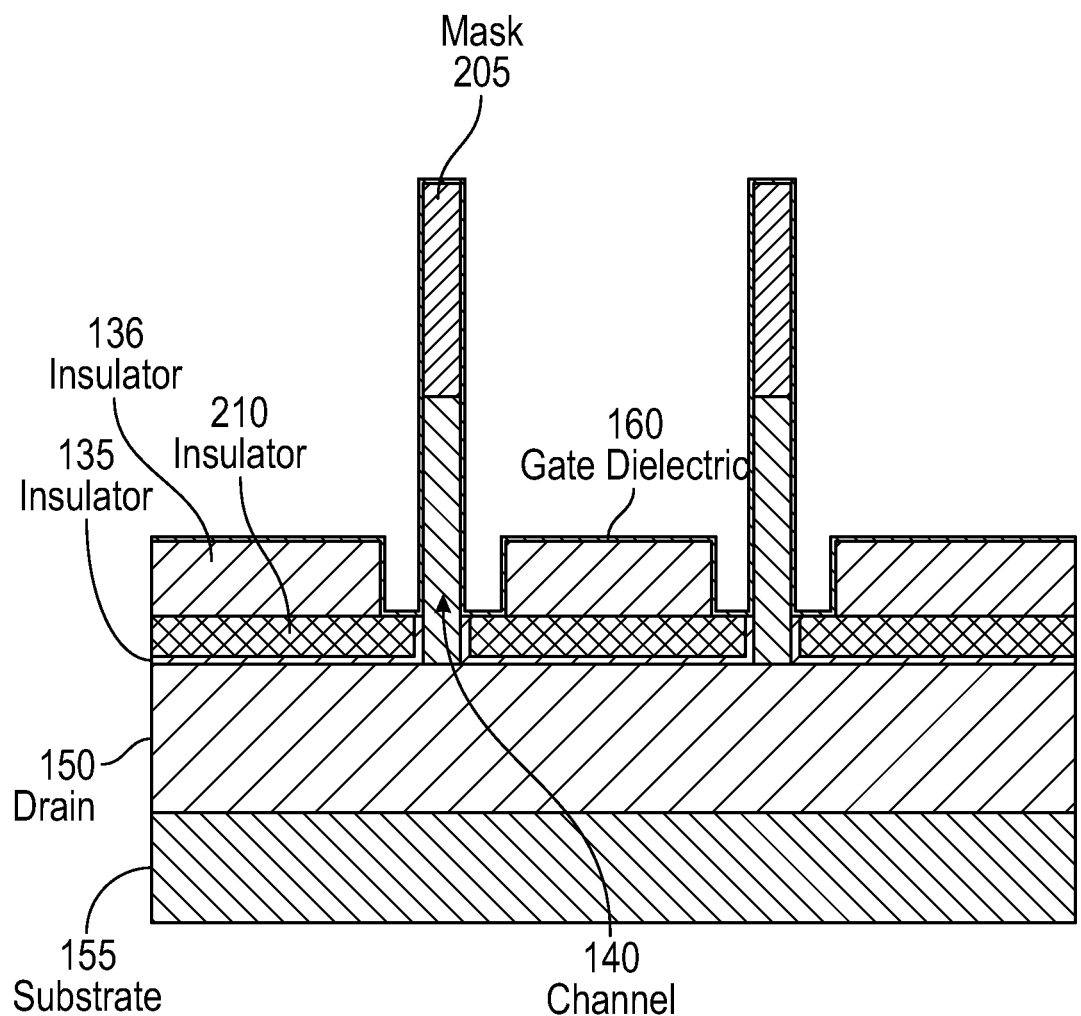

FIG. 2D illustrates conformally depositing the gate dielectric 160 on the top surfaces of the partial structure. Importantly, the gate dielectric 160 is deposited on the sides of the channel 140 to form a gate for the VFET. As noted above, the gate dielectric 160 can be any high-k dielectric.

Figure 2E:
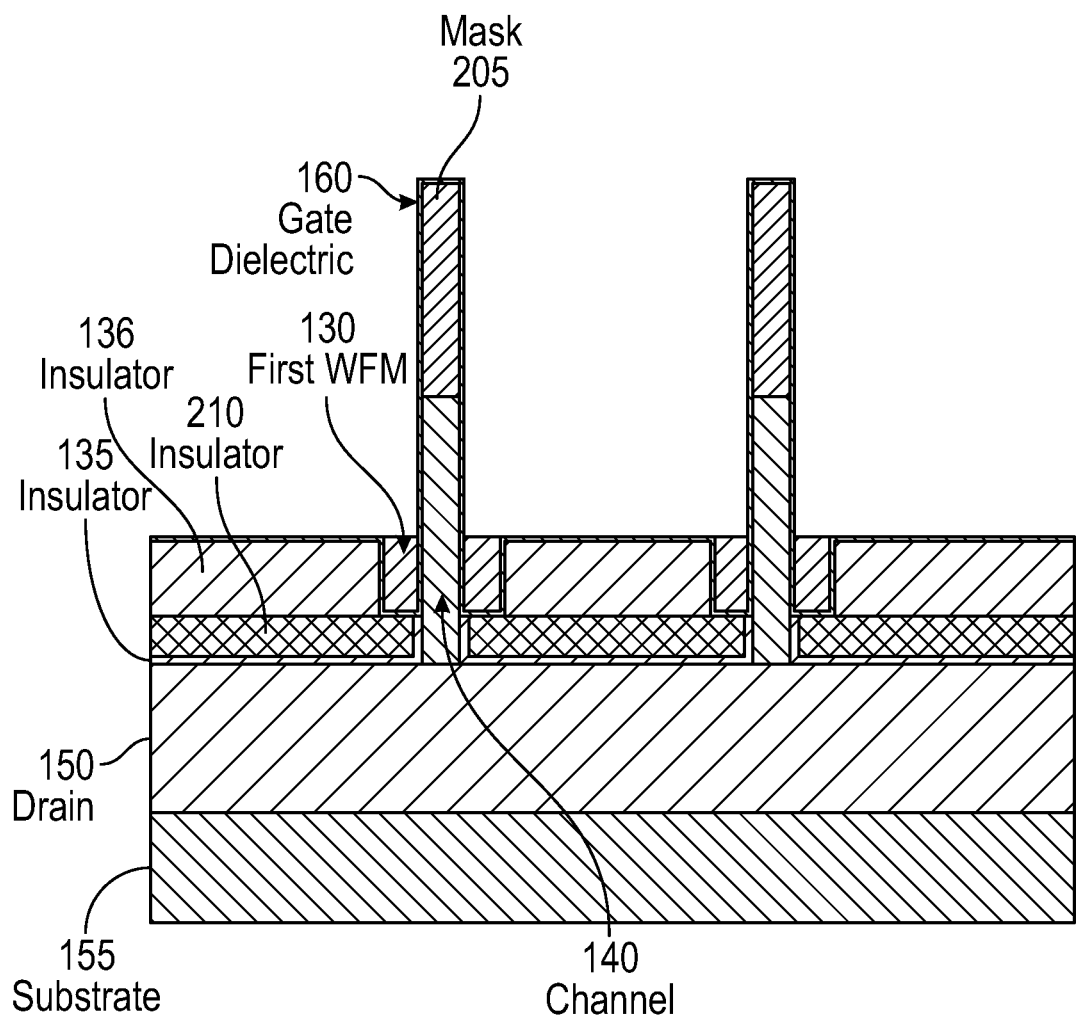

FIG. 2E illustrates depositing the first WFM 130 in the gap 215. In one embodiment, the first WFM 130 is deposited conformally on the structure until it is pinched off. An anisotropic etch can then be used to remove the excess first WFM 130 but leave the first WFM 130 in the gap 215 between the insulator 136 and the channel 140.

As will be discussed in more detail in FIGS. 3 and 4 below, the first WFM 130 can be formed using a single layer or single material deposited during a single deposition step, or the first WFM 130 can be formed using multiple layers of different materials deposited during multiple depositions steps. Thus, the first WFM 130 can be a single material or include multiple layers of different materials.

Figure 2F:
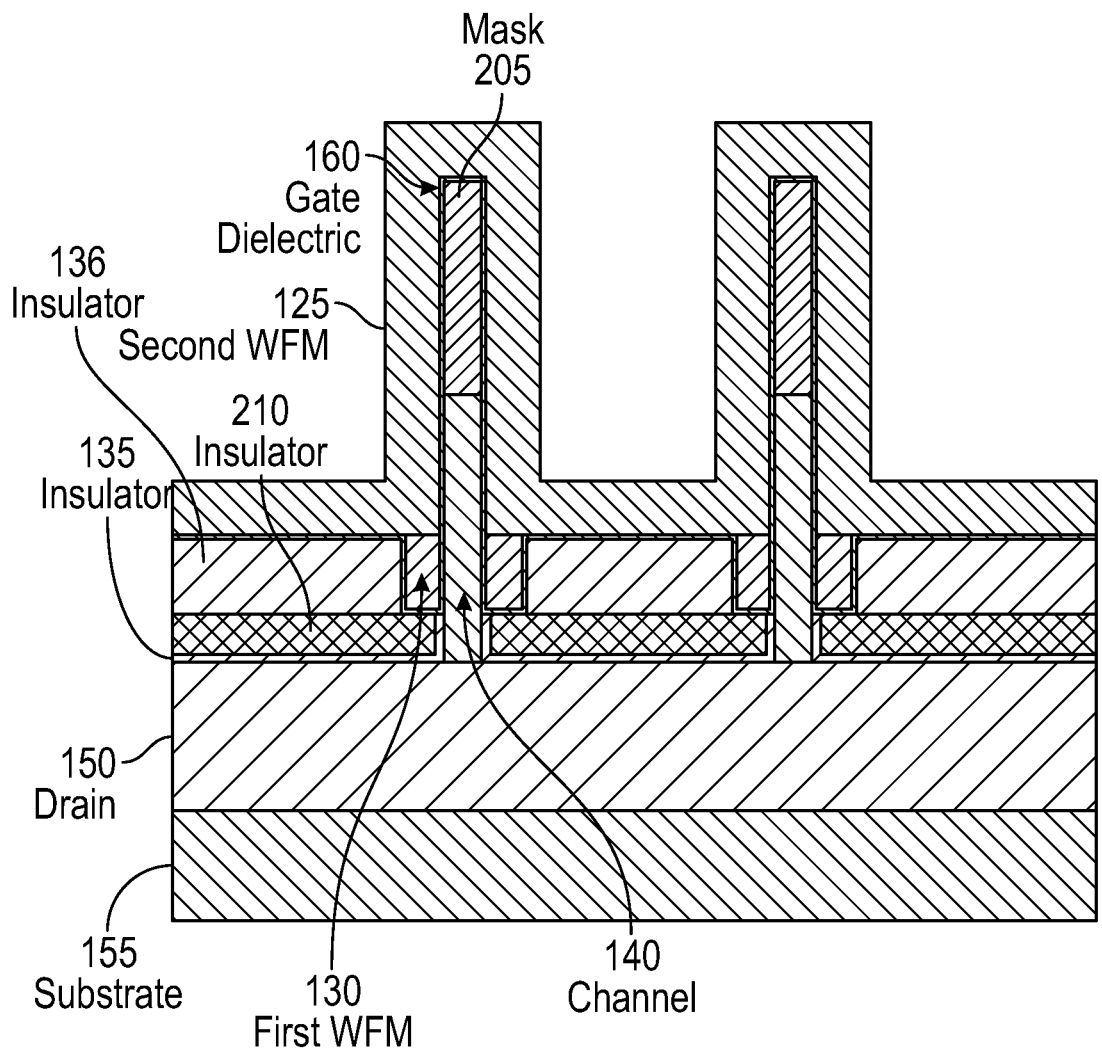

FIG. 2F illustrates forming or depositing the second WFM 125 onto the structure. In one embodiment, the second WFM 125 is deposited conformally on the structurally. However, the second WFM 125 can be deposited using any technique so long as that technique results in the second WFM 125 being deposited on top of the first WFM 130 and along the sides of the channel 140. As such, the combination of the first WFM 130 and the second WFM 125 can be used as a gate for the vertical FET.

Like the first WFM 130, the second WFM 125 can be formed using a single layer or single material deposited during a single deposition step, or the second WFM 125 can be formed using multiple layers of different materials deposited during multiple depositions steps. Thus, the second WFM 125 can be a single material or include multiple layers of different materials.

Although not shown here, additional processing steps can be performed on the structure FIG. 2F to result in the vertical FET in FIG. 1. For example, interlayer dielectric (ILD) (e.g., SiO2, or a thin SiN liner followed by SiO2 fill) can be deposited on the structure in FIG. 2F. A CMP process can be performed to reveal the hard mask 205. Then a selective etch process can be used to remove the hard mask 205 and expose a top surface of the channel 140. After that, exposed WFM and HfO2 is recessed to form cavity space between channel 140 and ILD. The top spacers 115, source 110, is then formed. After that, additional MOL ILD may be deposited, and contact 105 can then be formed on the structure to generate the VFET 100 illustrated in FIG. 1.

Figure 3:
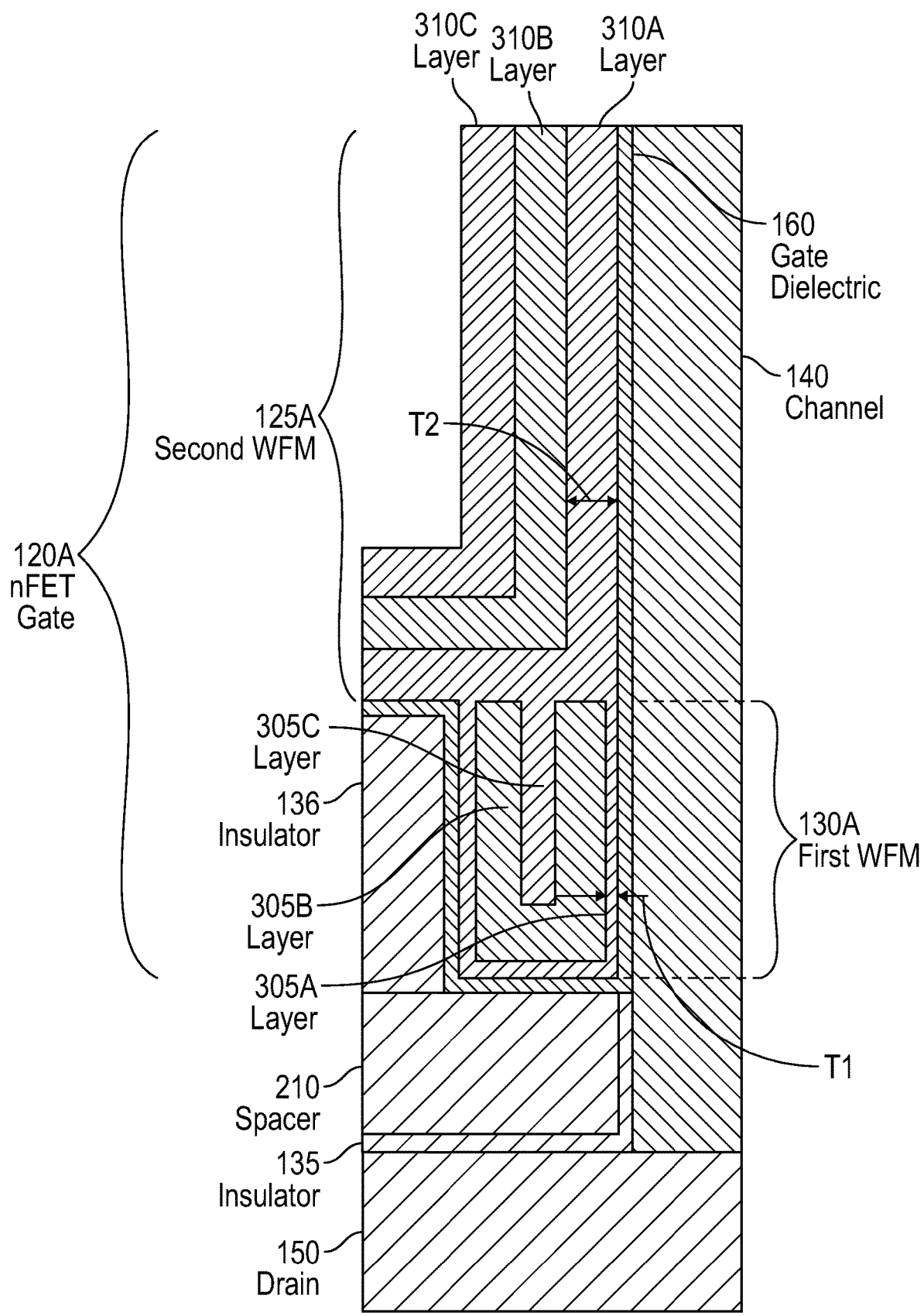
FIG. 3 illustrates a gate with multiple WFMs for a nFET, according to one embodiment.

FIG. 3 illustrates a gate 120A with multiple WFMs for a nFET, according to one embodiment. The nFET gate 120A includes a first WFM 130A and a second WFM 125A which have been formed on the gate dielectric 160 and the channel 140. In this example, the first WFM 130A includes three layers 305A-C.

In one embodiment, the first layer 305A of the first WFM 130A is TiN or TaN, the second layer 305B is an aluminum (Al) containing alloy (e.g., TiAlC or TaAlC), and the third layer 305C is TiN or TaN. In one embodiment, the first layer 310A of the second WFM 125A is TiN or TaN, the second layer 310B is an Al-containing alloy, and the third layer 310C is TiN or TaN. Thus, in this example, the three layers 305 of the first WFM 130A and the three layers 310 of the second WFM 125A can be formed from the same materials. However, the thickness of at least one of the layers is different. In FIG. 3, the layer 305A in the first WFM 130A has a thickness T1 that is smaller than the thickness T2 of the layer 310A in the second WFM 125A. This may result in the respective thicknesses of the other layers (e.g., the layers 305B, C and layers 310B, C) also being different. That is, FIG. 3 illustrates that the layer 305B can be thicker than the layer 310B and the layer 305C may be thinner than the layer 310C.

However, that is not a requirement. It may be desired that the layers 305B and 310C have the same thickness and the layers 305C and 310C have the same thickness. Or the layers 305B and 310C have the same thickness but the layers 305C and 310C have different thicknesses, or vice versa. In one embodiment, the thickness of the second layers 305B and 310B can be used to control the effective work functions. Here, the second layer 310B for the second WFM 125A may be thicker compared to the second layer 305B for the first WFM 130A, with a given first layer thickness.

Figure 4:
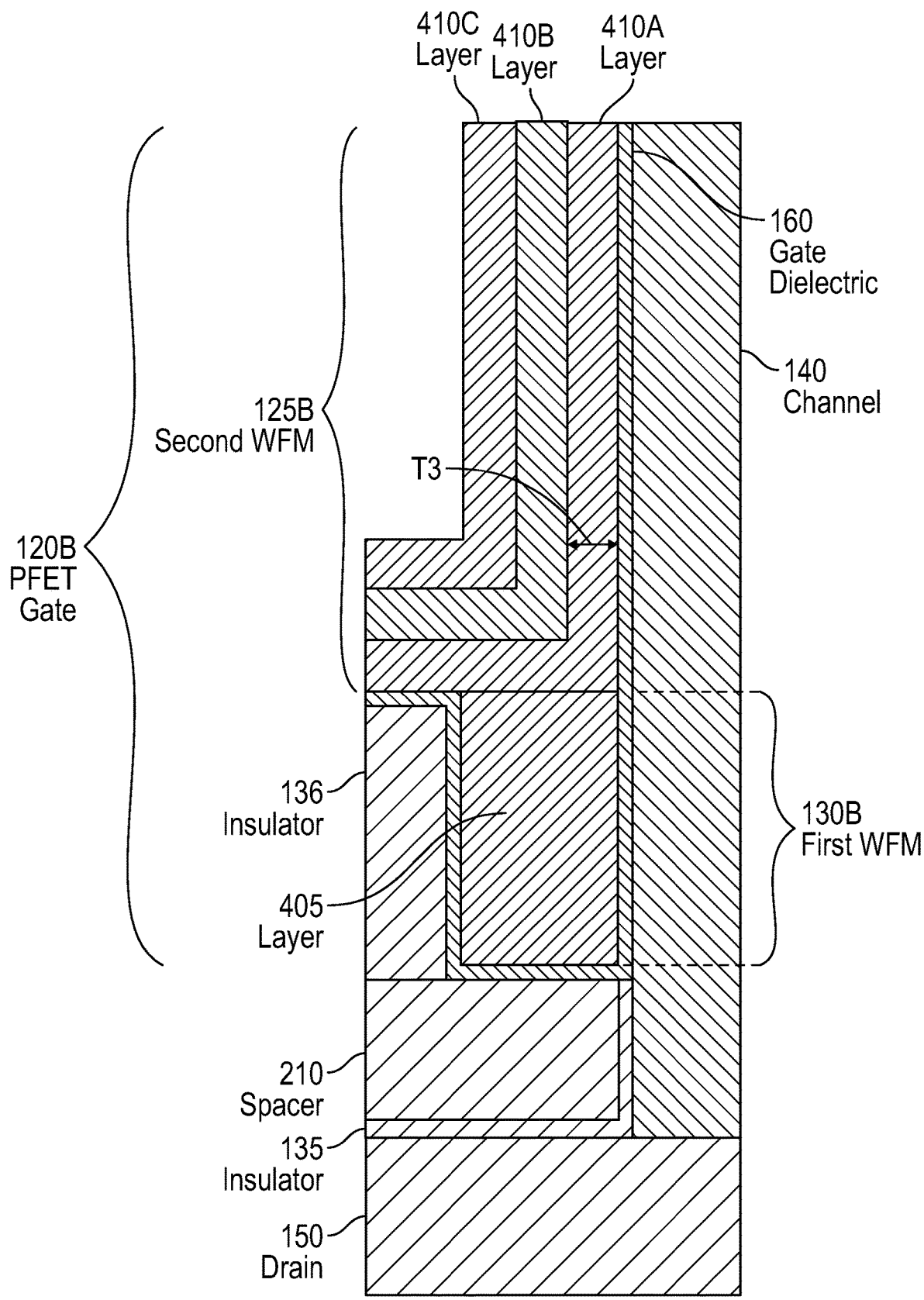
FIG. 4 illustrates a gate with multiple WFMs for a pFET, according to one embodiment.

FIG. 4 illustrates a gate with multiple WFMs for a pFET, according to one embodiment. The pFET gate 120B includes a first WFM 130B and a second WFM 125B which have been formed on the gate dielectric 160 and the channel 140. In this example, the first WFM 130B is formed from a single layer 405 (or single material), while the second WFM 125B is formed from three layers 410A-C.

In one embodiment, the layer 405 of the first WFM 130B is TiN or TaN. In one embodiment, the first layer 410A of the second WFM 125A is TiN or TaN, the second layer 410B is an Al-containing alloy, and the third layer 410C is TiN or TaN. Thus, in this example, the first WFM 130B has a different number of layers and is formed from a different composition of materials than the second WFM 125B. Further, in one embodiment, the first layer 410A of the second WFM 125B has a thickness T3 that is greater than both of the thicknesses T1 and T2 of the first layer 305A of the first WFM 130A and the first layer 310A of the second WFM 125A in FIG. 3 (i.e., the nFET gate 120A). Thus, in this example, the thicknesses of the first layers 305A and 310A in FIG. 3 and the first layer 410A in FIG. 4 have the relationship T1<T2<T3.

The nFET gate 120A and the pFET gate 120B illustrated in FIGS. 3 and 4 provide appropriate nFET and pFET threshold voltages as well as reduced oxide electrical field near the bottom drain (not shown in these figures). As a result, the gates 120A and 120B reduce the GIDL.

FIGS. 5A-5G illustrate a process for forming a gate in a VFET with multiple WFMs, according to one embodiment. The process is assumed to start with the structure in FIG. 2F. However, instead of processing the structure to result in the VFET 100, FIGS. 5A-5G illustrate an alternative embodiment where a different WFM is disposed near the source.

Figure 5A:
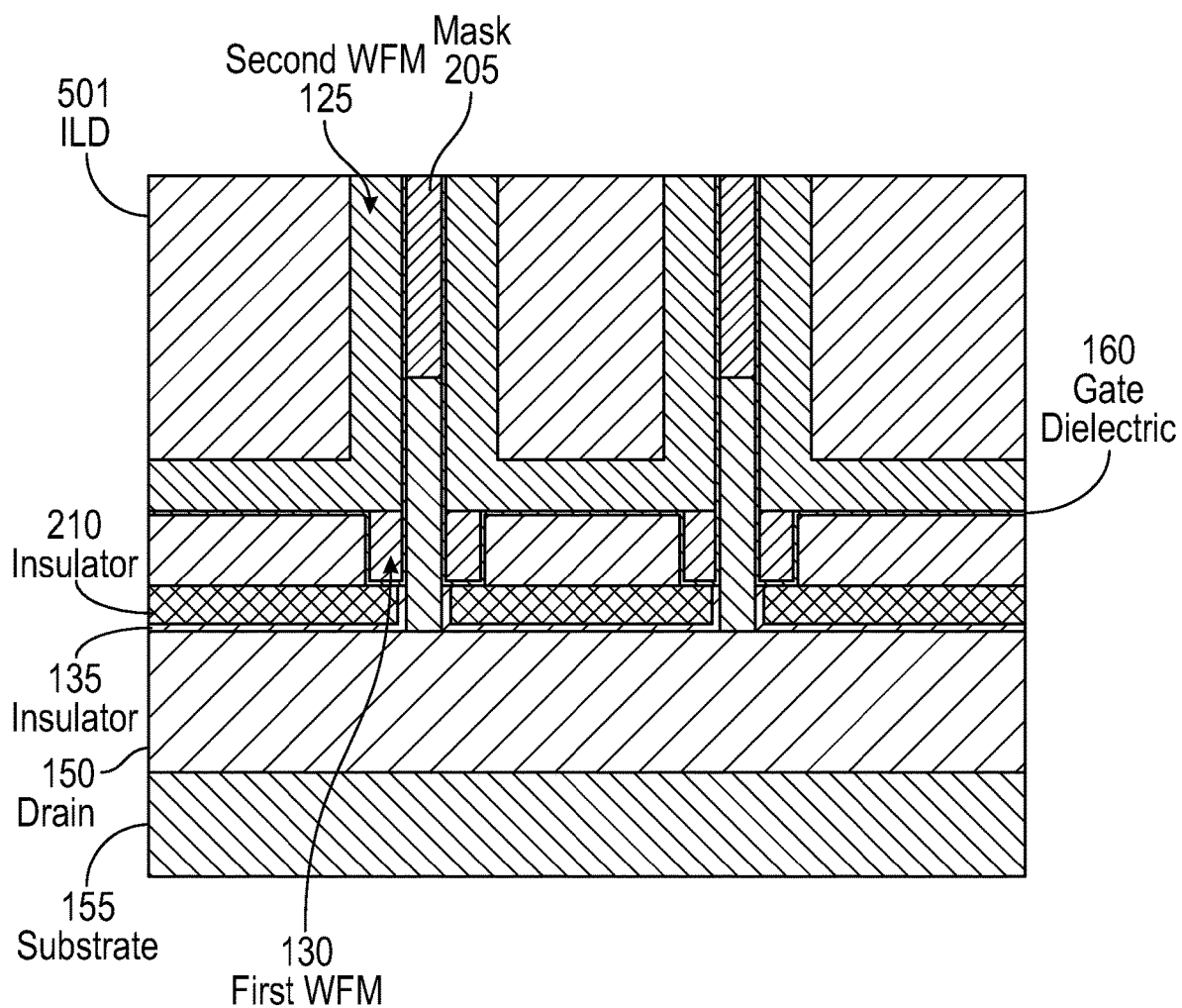
FIGS. 5A-5G illustrate a process for forming a gate in a vertical FET with multiple WFMs, according to one embodiment.

FIG. 5A illustrates depositing an interlayer dielectric (ILD) 501 (e.g., a dielectric material) on the structure shown in FIG. 2F and then etching down the top of the structure (e.g., planarizing the structure) to expose a top surface of the hard mask 205. In this example, the ILD 501 could be dielectrics like a thin SiN liner followed by SiO2 fill.

Figure 5B:
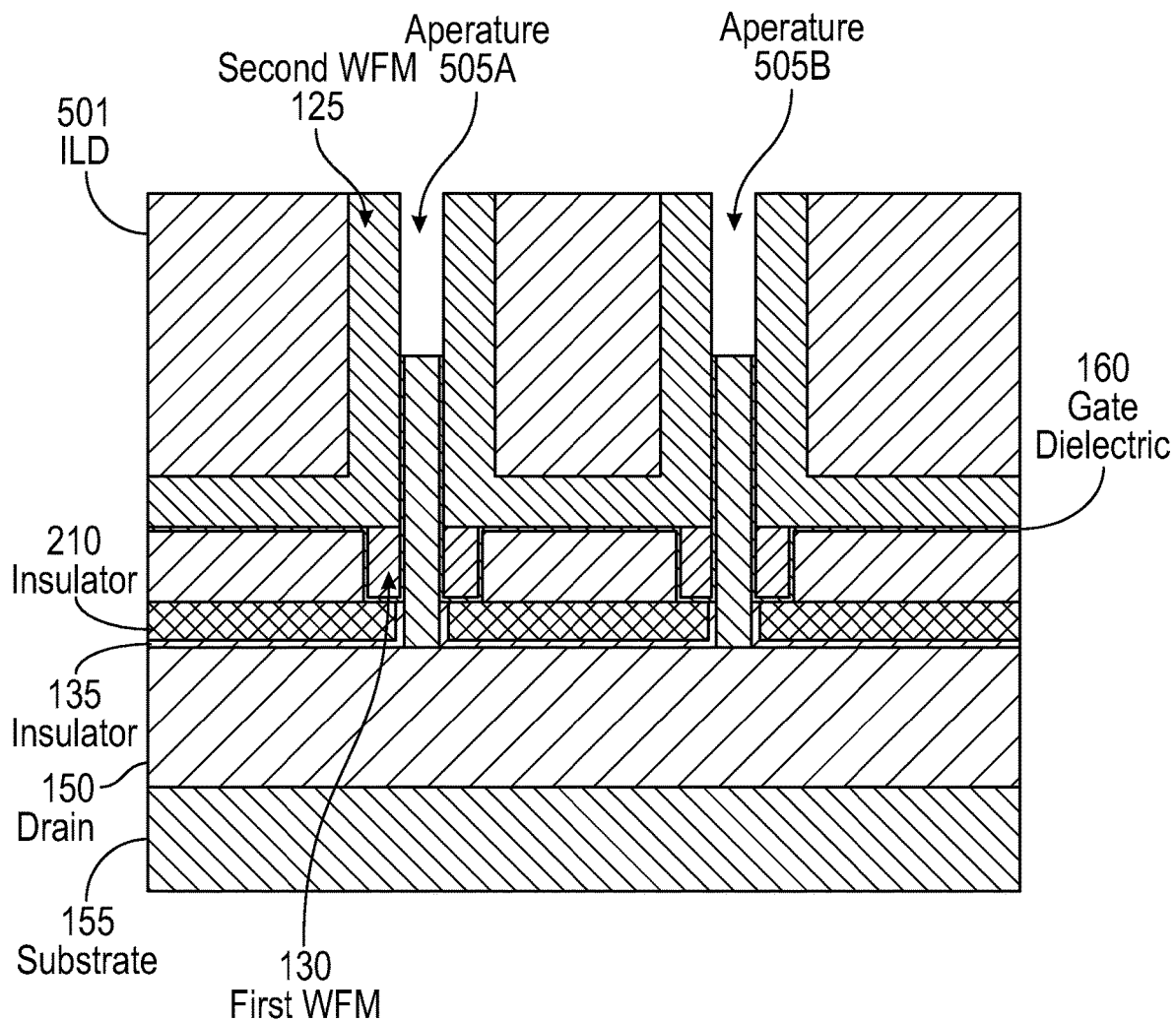

FIG. 5B illustrates selectively etching the structure to remove the hard mask 205 and form the apertures 505A and 505B. For example, selective RIE or wet etch could be used to remove the material forming the hard mask 205 without affecting the other material exposed at the top side of the structure.

Figure 5C:
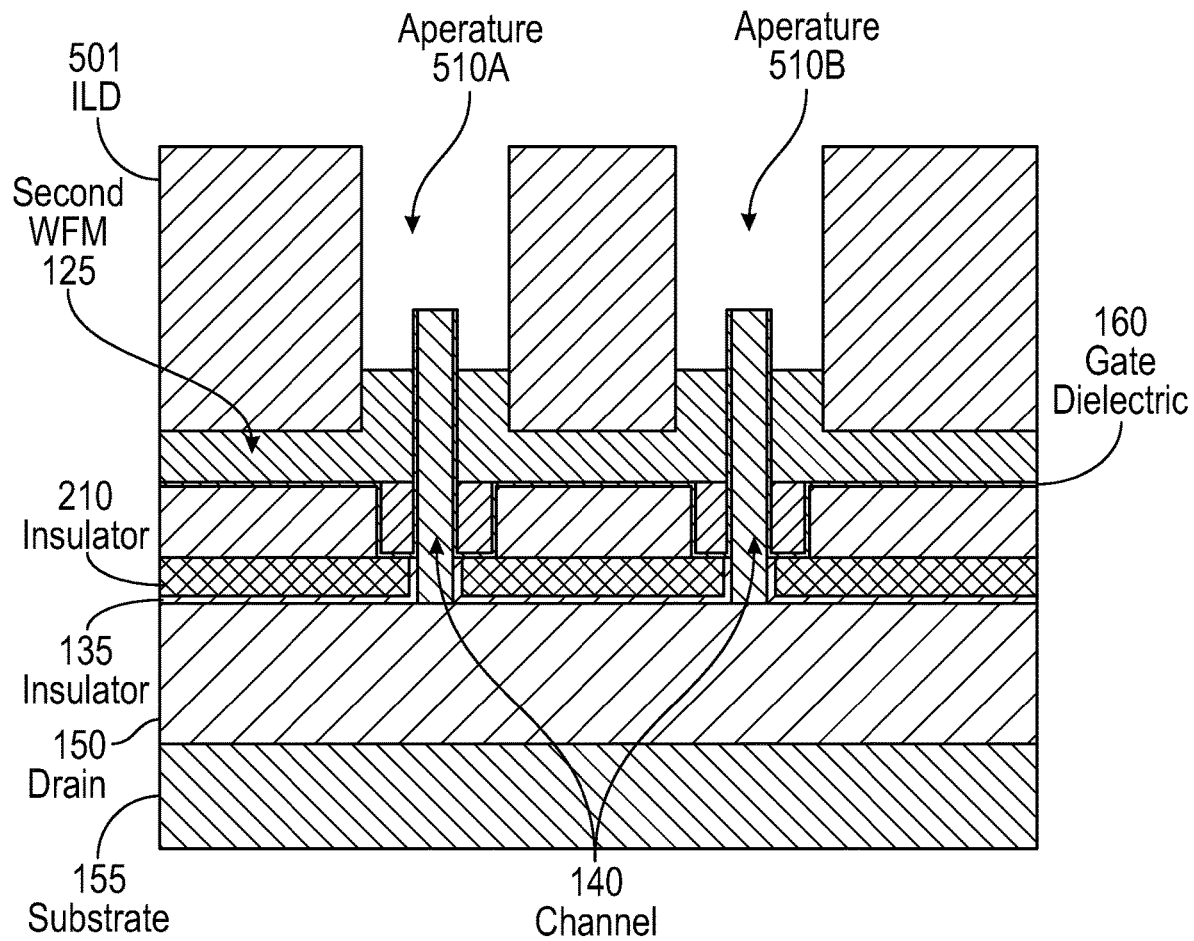

FIG. 5C illustrates removing a portion of the second WFM 125 to expose a portion of the gate dielectric 160 at the top of the channel 140. For example, a timed etch can be used to remove some of the second WFM 125 to form the apertures 510A and 510B. As shown, the top portion of the channel 140 (along with the gate dielectric 160) form a post in the middle of the apertures 510.

Figure 5D:
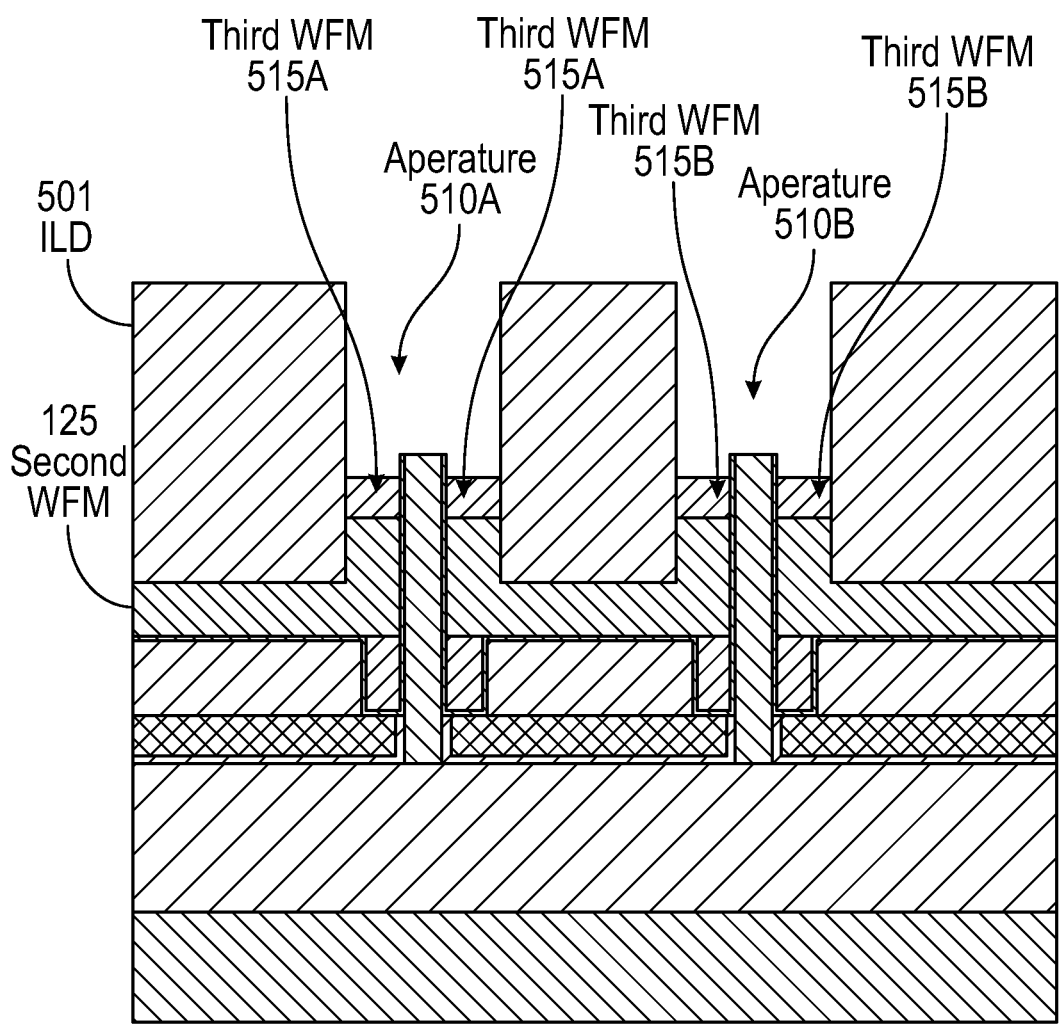

FIG. 5D illustrates depositing a third WFM 515 around a portion of the channel 140 and the gate dielectric 160 protruding in the apertures 510. In one embodiment, the third WFM 515A and 515B in the respective apertures 510A and 510B are the same. As such, the third WFMs 515A and 515B can be formed in the same deposition step or steps and have the same material or materials (or the same layers).

Moreover, in one embodiment, third WFM 515 is the same as the first WFM 130. For example, if the structure is a vertical nFET, both the third WFM 515 and the first WFM 130 may have three layers, e.g., a first layer of TiN, a second layer of an Al-containing alloy, and a third layer of TiN. However, if the structure is a pFET, both the third WFM 515 and the first WFM 130 may be a single layer of TiN. In one embodiment, the layer or layers in the third WFM 515 may also have the same thickness or thicknesses as the layer or layers in the first WFM 130. However, in another embodiment, the layer or layers of the third WFM 515 have a different thickness or different thickness of the layer or layers in the first WFM 130.

More generally, the third WFM 515 is different from the second WFM 125. That is, while the third WFM 515 may be the same as the first WFM 130, GIDL may be mitigated so long as the third WFM 515 is different from the second WFM 125 even if the third WFM 515 is not the same as the first WFM 130. Stated differently, to reduce the GIDL, the third WFM 515 should be different than the second WFM 130 by either having different materials as the second WFM 130, or layers with different thicknesses. The third WFM 515 can be different from, or the same as, the first WFM 125 and still reduce GIDL in the vertical FET.

Figure 5E:
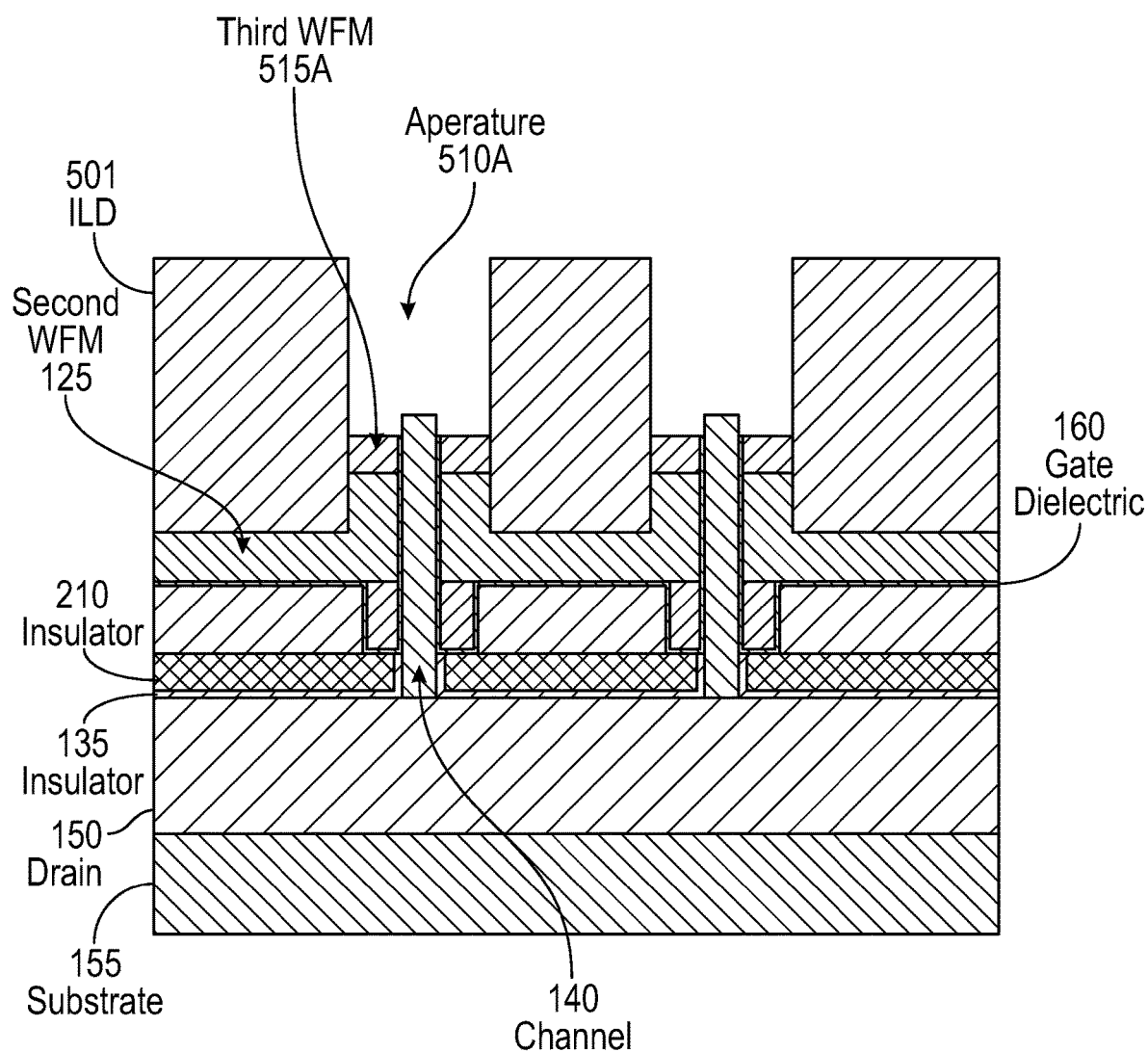

FIG. 5E illustrates removing a portion of the gate dielectric 160 still exposed after forming the third WFM 515. Removing this portion of the gate dielectric 160 exposes the sides of the channel 140 in the apertures 510.

Figure 5F:
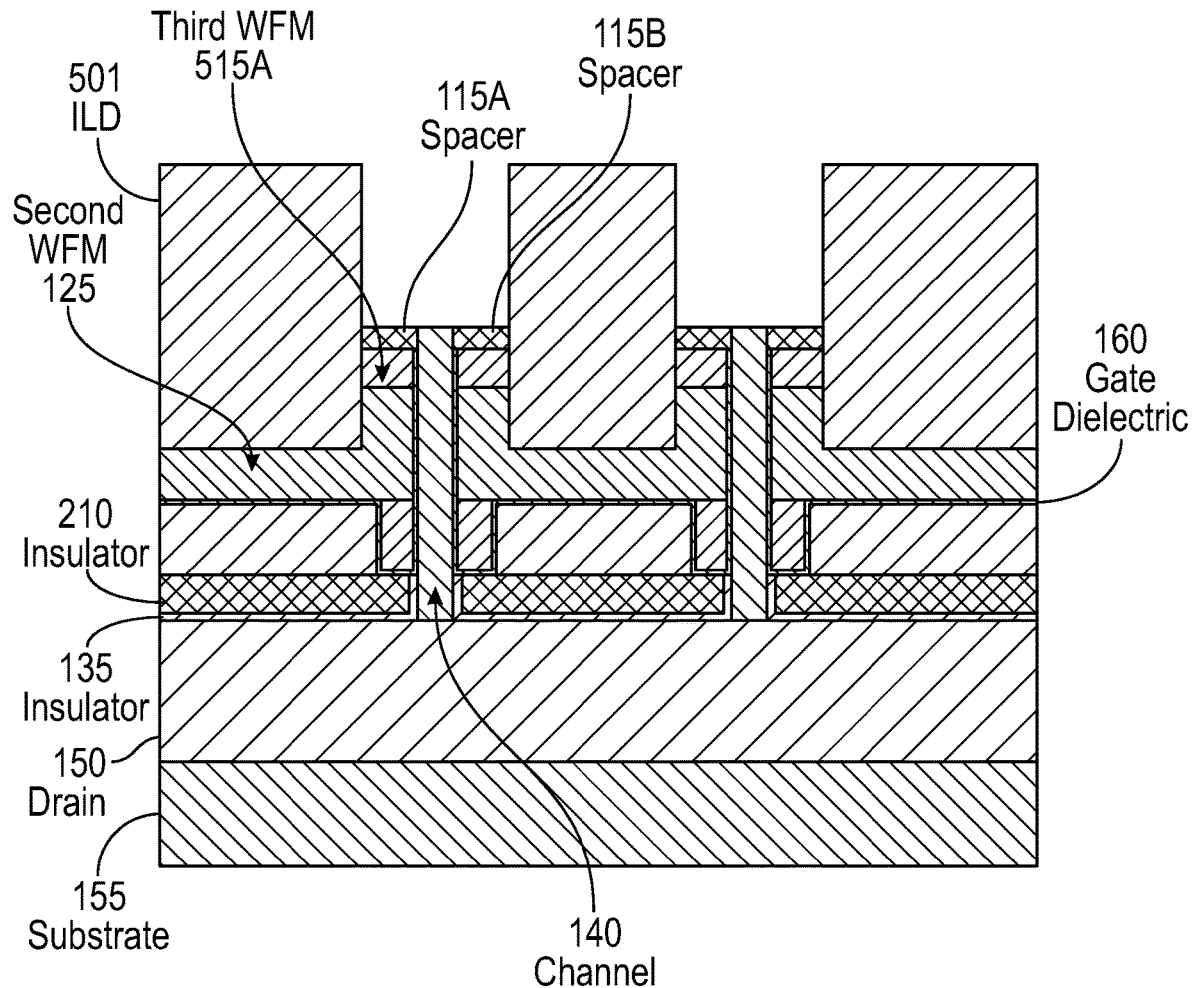

FIG. 5F illustrates forming the top spacers 115 along the sides of the channel 140 that were exposed in FIG. 5E. Because the gate dielectric 160 was removed, the top spacers 115 directly contact the channel 140. The top spacers 115 can be formed by a conformal dielectric deposition followed by isotropic etching back process to only leave the spacer material that is pinched-off in the cavity between the ILD 501 and channel 140.

Figure 5G:
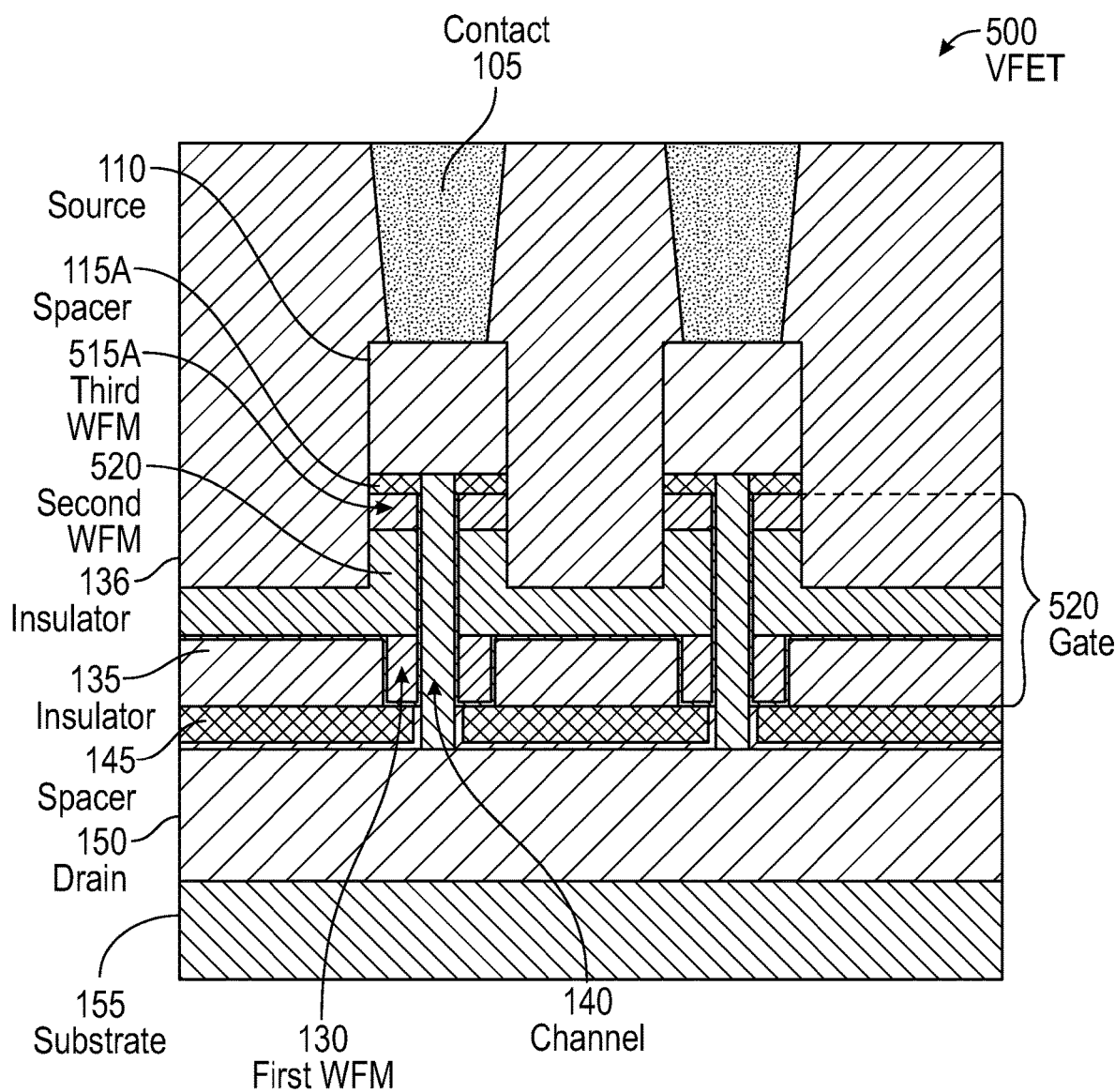

FIG. 5G illustrates forming the source 110 and the contact 105 above the spacers 115 and the channel 140. The embodiments herein are not limited to any particular technique for forming these components. Moreover, because the structure includes the third WFM 515, which can be similar to the first WFM 130, the position of the source 110 and the drain 150 are interchangeable. Thus, the structure could include a top source/drain with a corresponding bottom source/drain.

In general, the VFET 500 in FIG. 5G is the same as the VFET 100 in FIG. 1 except that the gate 520 in FIG. 5G includes the first WFM 130, the second WFM 125, and the third WFM 515, while the gate 120 in FIG. 1 includes only the first WFM 130 and the second WFM 125. Specifically, in the gate 520, the second WFM 125 is disposed between the first WFM 130 and the third WFM 515 such that the first WFM 130 is closer to the bottom source/drain than the second WFM 130 and the third WFM 515 is closer to the top source/drain than the second WFM 130. Further, the first and third WFMs 125, 515 are different than the second WFM 125, whether because they have different materials, or have at least one layer with a different thickness. Moreover, the first WFM 125 can be the same as the third WFM 515 (e.g., the same material and same layer thickness), or these WFMs may be different.

Figure 6:
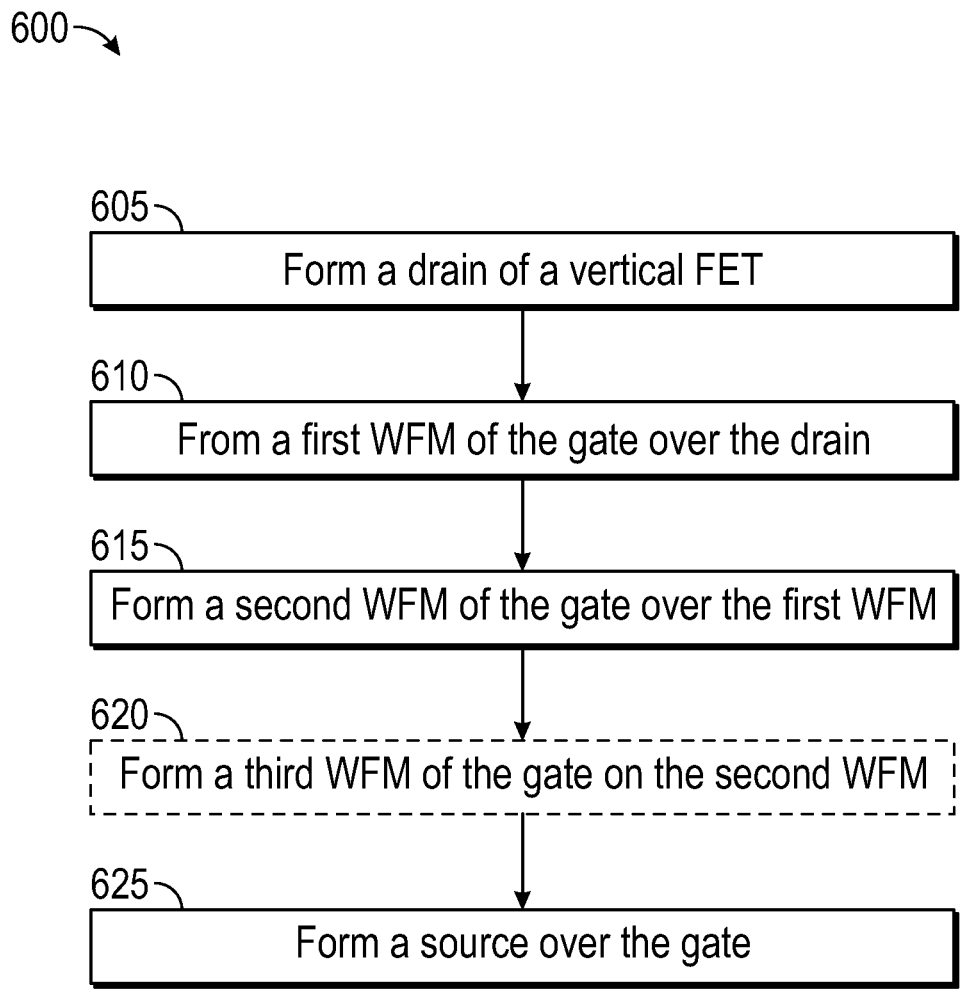
FIG. 6 is a flowchart for forming a gate in a vertical FET with multiple WFMs, according to one embodiment.

FIG. 6 is a flowchart of a method 600 for forming a gate in a VFET with multiple WFMs, according to one embodiment. At block 605, a drain is formed on a substrate.

At block 610, a first WFM of the gate for the FET is formed near the drain. As shown in FIG. 1, other materials and layers can insulate the drain from the first WFM of the gate.

At block 615, a second WFM of the gate is formed on the first WFM. In one embodiment, the first and second WFMs directly contact each other to form an electrical connection. That way, the same gate voltage can be driven on both the first and second WFMs.

Optionally, at block 620, a third WFM of the gate is formed on the second WFM. In one embodiment, the second and third WFMs directly contact each other to form an electrical connection. That way, the same gate voltage can be driven on the first, second, and third WFMs. FIG. 5G illustrates an embodiment where the gate 520 includes three WFMs. In contrast, FIG. 1 illustrates an embodiment where the gate 120 includes only two WFMs (e.g., where block 620 would be skipped or omitted when fabricating the VFET 100).

At block 625, a source is formed over the gate. As shown in FIGS. 1 and 5G, one or more layers can be formed between the top of the gate (e.g., the top of the second WFM 125 in FIG. 1 or the top of the third WFM 515 in FIG. 5G) to insulate the gate from the source.

The method 600 describes a general process flow for forming a gate of VFET (which includes two or more WFMs) between a source and drain. The method 600 is not intended to list every step that can be used to fabricate the VFET. One of ordinary skill will recognize there are many different steps (and corresponding components) that can be added to the method 600.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In the preceding, reference is made to embodiments presented in this disclosure. However, the scope of the present disclosure is not limited to specific described embodiments. Instead, any combination of the features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the aspects, features, embodiments and advantages discussed herein are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

Aspects of the present invention may take the form of an entirely hardware embodiment, an entirely software embodiment (including firmware, resident software, microcode, etc.) or an embodiment combining software and hardware aspects that may all generally be referred to herein as a "circuit," "module" or "system."

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the foregoing is directed to embodiments of the present invention, other and further embodiments of the invention may be devised without departing from the basic scope thereof, and the scope thereof is determined by the claims that follow.

What is claimed is:

1. A vertical field effect transistor (VFET) comprising:
   a drain;
   a source;
   a channel extending, in a direction perpendicular to a substrate of the VFET, between the drain and source; and
   a gate comprising a first work function metal (WFM) and a second WFM disposed between the first WFM and the source,
   wherein the first WFM is disposed closer to the drain than is the second WFM,
   wherein the first WFM comprises a first plurality of layers and the second WFM comprises a second plurality of layers,
   wherein a first layer of the first plurality of layers, disposed closest to a side of the channel, is thinner than a first layer of the second plurality of layers, disposed closest to the side of the channel, and
   wherein the first layer of the first plurality of layers and the first layer of the second plurality of layers are formed of a same material.

2. The VFET of claim 1, wherein the same material comprises TiN.

3. The VFET of claim 2, wherein a second layer of the first plurality of layers and a second layer of the second plurality of layers both comprise an Al-containing alloy.

4. The VFET of claim 3, wherein a third layer of the first plurality of layers and a third layer of the second plurality of layers both comprise TiN, wherein the second layer of the first plurality of layers is disposed between the first and third layers of the first plurality of layers, and the second layer of the second plurality of layers is disposed between the first and third layers of the second plurality of layers.

5. The VFET of claim 1, wherein the gate further comprises a third WFM disposed along a side of the channel, wherein the third WFM is different from the second WFM, and the second WFM is disposed between the first WFM and the third WFM.

6. The VFET of claim 5, wherein the third WFM has a same structure and material as the first WFM.

7. A vertical field effect transistor (VFET) comprising:
   a drain;
   a source;
   a channel extending, in a direction perpendicular to a substrate of the VFET, between the drain and source; and
   a gate comprising a first WFM and a second WFM disposed between the first WFM and the source,
   wherein the first WFM is disposed closer to the drain than is the second WFM,
   wherein the first WFM comprises a single layer and the second WFM comprises a first plurality of layers,
   wherein a first layer of the first plurality of layers, disposed closest to a side of the channel, is thinner than the single layer, and
   wherein the first layer of the first plurality of layers and the single layer are formed of a same material.

8. The VFET of claim 7, wherein the same material comprises TiN.

9. The VFET of claim 8, wherein a second layer of the first plurality of layers comprises an Al-containing alloy and a third layer of the first plurality of layers comprises TiN, and wherein the second layer is disposed between the first and third layers.

10. The VFET of claim 7, wherein the gate further comprises a third WFM disposed along a side of the channel, wherein the third WFM is different from the second WFM, and the second WFM is disposed between the first WFM and the third WFM.

11. The VFET of claim 10, wherein the third WFM has a same structure and material as the first WFM.

12. A method of forming a vertical field effect transistor (VFET), the method comprising:
- forming a drain of the VFET;
- forming a first WFM of a gate above the drain, wherein the first WFM is disposed in a first horizontal plane through which a channel of the VFET extends, and wherein the first WFM comprises a first plurality of layers;
- forming a second WFM of the gate directly on the first WFM, wherein the second WFM is disposed in a second horizontal plane through which the channel extends, and wherein the second WFM comprises a second plurality of layers; and
- forming a source of the VFET,
- wherein the source and the drain are coupled by the channel,
- wherein a first layer of the first plurality of layers, disposed closest to a side of the channel, is thinner than a first layer of the second plurality of layers, disposed closest to the side of the channel, and
- wherein the first layer of the first plurality of layers and the first layer of the second plurality of layers are formed of a same material.

13. The method of claim 12, wherein both comprise the same material comprises TiN.

14. The method of claim 12, further comprising:
- forming, before forming the source, a third WFM of the gate directly on the second WFM, wherein the third WFM is different from the second WFM.

15. The method of claim 13, wherein a second layer of the first plurality of layers comprises an Al-containing alloy and a third layer of the first plurality of layers comprises TiN, and wherein the second layer is disposed between the first and third layers.

* * * * *